(12) United States Patent
Matsuda et al.

(10) Patent No.: US 11,555,755 B2
(45) Date of Patent: Jan. 17, 2023

(54) METHOD OF CALIBRATING MULTIPLE CHAMBER PRESSURE SENSORS

(71) Applicant: Tokyo Electron Limited, Tokyo (JP)

(72) Inventors: Risako Matsuda, Miyagi (JP); Keita Shouji, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 18 days.

(21) Appl. No.: 17/196,272

(22) Filed: Mar. 9, 2021

(65) Prior Publication Data

US 2021/0302257 A1 Sep. 30, 2021

(30) Foreign Application Priority Data

Mar. 31, 2020 (JP) .............................. JP2020-064337

(51) Int. Cl.
| | | |
|---|---|---|
| *G01L 27/00* | (2006.01) | |
| *G01M 3/26* | (2006.01) | |
| *G01L 13/00* | (2006.01) | |
| *G01L 19/00* | (2006.01) | |
| *G01L 21/02* | (2006.01) | |
| *G01L 7/00* | (2006.01) | |
| *H01L 21/66* | (2006.01) | |
| *H01L 21/67* | (2006.01) | |

(52) U.S. Cl.
CPC ............ *G01L 27/005* (2013.01); *G01L 13/00* (2013.01); *G01L 19/0007* (2013.01); *G01M 3/26* (2013.01); *G01L 7/00* (2013.01); *G01L 21/02* (2013.01); *G01L 27/002* (2013.01); *H01L 21/67253* (2013.01); *H01L 22/12* (2013.01)

(58) Field of Classification Search
CPC ..... G01L 27/005; G01L 13/00; G01L 19/0007; G01L 27/002; G01L 7/00; G01L 21/02; G01M 3/26; H01L 21/67253; H01L 22/12
See application file for complete search history.

(56) References Cited

U.S. PATENT DOCUMENTS

| | | | | |
|---|---|---|---|---|
| 2011/0265549 A1* | 11/2011 | Cruse | ...................... | G01F 25/00 |
| | | | | 73/1.16 |
| 2018/0073911 A1* | 3/2018 | Amikura | .................. | G01F 13/00 |
| 2018/0188101 A1* | 7/2018 | Weindl | ..................... | G01F 25/14 |

FOREIGN PATENT DOCUMENTS

JP 2010251464 A 11/2010

* cited by examiner

*Primary Examiner* — Randy W Gibson
*Assistant Examiner* — John M Royston
(74) *Attorney, Agent, or Firm* — Nath, Goldberg & Meyer; Jerald L. Meyer; Tanya E. Harkins (57) ABSTRACT

There is provided a method of calibrating multiple chamber pressure sensors of a substrate processing system. The substrate processing system includes: multiple chambers; multiple chamber pressure sensors; multiple gas suppliers configured to supply a gas to an internal space of the multiple chambers; multiple exhausters connected to the internal spaces of the multiple chambers via multiple exhaust flow paths; and multiple first gas flow paths. The method includes: acquiring a third volume, which is a sum of a first volume and a second volume; acquiring a first pressure change rate of the internal space of a selected chamber; calculating a second pressure change rate of the internal space of the selected chamber; and calibrating the selected chamber pressure sensor such that a difference between the first pressure change rate and the second pressure change rate is within a preset range.

8 Claims, 6 Drawing Sheets

FIG. 2

METHOD OF CALIBRATING MULTIPLE CHAMBER PRESSURE SENSORS

CROSS-REFERENCE TO RELATED APPLICATION

This application is based upon and claims the benefit of priority from Japanese Patent Application No. 2020-064337, filed on Mar. 31, 2020, the entire contents of which are incorporated herein by reference.

TECHNICAL FIELD

An exemplary embodiment of the present disclosure relates to a method of calibrating multiple chamber pressure sensors.

BACKGROUND

In the manufacture of electronic devices, a substrate processing system is used. The substrate processing system includes multiple chambers. When substrate processing is performed, gas is supplied into each chamber in the state in which a substrate is disposed within the chamber. The pressure within the chamber affects substrate processing results. Therefore, the pressure within the chamber is measured by a chamber pressure sensor. The state of the chamber pressure sensor may change over time. Accordingly, the chamber pressure sensor needs to be calibrated. Patent Document 1 discloses a technique for calibrating a chamber pressure sensor.

PRIOR ART DOCUMENT

Patent Document

Patent Document 1: Japanese Laid-Open Patent Publication No. 2010-251464

SUMMARY

According to one embodiment of the present disclosure, there is provided a method of calibrating multiple chamber pressure sensors of a substrate processing system. The substrate processing system includes multiple chambers, multiple chamber pressure sensors, multiple gas suppliers, multiple exhaust devices, and multiple first gas flow paths. The multiple chamber pressure sensors are installed so as to measure each internal pressure of the multiple chambers, respectively. The multiple gas suppliers are configured such that each gas supplier supplies a gas to the internal space of a corresponding one of the multiple chambers. The multiple exhaust devices are connected to the internal spaces of the multiple chambers via multiple exhaust flow paths, respectively. Each of the multiple first gas flow paths connects a corresponding one of the multiple gas suppliers to a one of the multiple chambers. The above-mentioned method includes a step of acquiring a third volume, a step of acquiring a first pressure change rate, a step of calculating a second pressure change rate, and a step of calibrating a chamber pressure sensor. In the step of acquiring the third volume, the third volume, which is the sum of a first volume and a second volume, is acquired. The first volume is the volume of a first gas flow path selected from the multiple first gas flow paths connected to a gas supplier selected from the multiple gas suppliers. The second volume is the volume of the internal space of a selected chamber connected to the selected first gas flow path among the multiple chambers. In the step of acquiring the first pressure change rate, the first pressure change rate is acquired using a selected chamber pressure sensor for the selected chamber among the multiple chamber pressure sensors. In the step of acquiring the first pressure change rate, the first pressure change rate of the internal space of the selected chamber is caused by allowing the gas having a preset flow rate to flow into the internal space of the selected chamber from the selected gas supplier through the first gas flow path, is acquired. In the step of calculating the second pressure change rate, the preset flow rate of the gas, which is caused to flow in the step of acquiring the first pressure change rate, and the first volume are used. In the step of calculating the second pressure change rate, the gas, which is caused to flow in the step of acquiring the first pressure change rate, is regarded as an ideal gas. In the step of calculating the second pressure change rate, the second pressure change rate of the internal space of the selected chamber, which is caused by allowing the gas to flow in the step of acquiring the first pressure change rate, is calculated. In the step of calibrating the chamber pressure sensor, the selected chamber pressure sensor is calibrated such that the difference between the first pressure change rate and the second pressure change rate is within a preset range. In the above-mentioned method, a sequence including the step of acquiring the third volume, the step of acquiring the first pressure change rate, the step of acquiring the second pressure change rate, and the step of calibrating the chamber pressure sensor is repeated. In the-above-mentioned method, the multiple chamber pressure sensors are sequentially selected as the selected chamber pressure sensor, and then the sequence is repeated.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, various exemplary embodiments will be described. In an exemplary embodiment, there is provided a method of calibrating multiple chamber pressure sensors of a substrate processing system. The substrate processing system includes multiple chambers, multiple chamber pressure sensors, multiple gas suppliers, multiple exhaust devices, and multiple first gas flow paths. The multiple chamber pressure sensors are installed so as to measure each internal pressure of the multiple chambers, respectively. The multiple gas suppliers are configured such that each gas supplier supplies a gas to the internal space of a corresponding one of the multiple chambers. The multiple exhaust devices are connected to the internal spaces of the multiple chambers via multiple exhaust flow paths, respectively. Each of the multiple first gas flow paths connects a corresponding one of the multiple gas suppliers to a one of the multiple chambers. The above-mentioned method includes a step of acquiring a third volume, a step of acquiring a first pressure change rate, a step of calculating a second pressure change rate, and a step of calibrating a chamber pressure sensor. In the step of acquiring the third volume, the third volume, which is the sum of a first volume and a second volume, is acquired. The first volume is the volume of a first gas flow path selected from the multiple first gas flow paths connected to a gas supplier selected from the multiple gas suppliers. The second volume is the volume of the internal space of a selected chamber connected to the selected first gas flow path among the multiple chambers. In the step of acquiring the first pressure change rate, the first pressure change rate is acquired using a selected chamber pressure sensor for the selected chamber among the multiple chamber pressure sensors. In the step of acquiring the first pressure change rate, the first pressure change rate of the internal space of the selected chamber is caused by allowing the gas having a preset flow rate to flow into the internal space of the selected chamber from the selected gas supplier through the first gas flow path, is acquired. In the step of calculating the second pressure change rate, the preset flow rate of the gas, which is caused to flow in the step of acquiring the first pressure change rate, and the first volume are used. In the step of calculating the second pressure change rate, the gas, which is caused to flow in the step of acquiring the first pressure change rate, is regarded as an ideal gas. In the step of calculating the second pressure change rate, the second pressure change rate of the internal space of the selected chamber, which is caused by allowing the gas to flow in the step of acquiring the first pressure change rate, is calculated. In the step of calibrating the chamber pressure sensor, the selected chamber pressure sensor is calibrated such that the difference between the first pressure change rate and the second pressure change rate is within a preset range. In the above-mentioned method, a sequence including the step of acquiring the third volume, the step of acquiring the first pressure change rate, the step of acquiring the second pressure change rate, and the step of calibrating the chamber pressure sensor is repeated. In the-above-mentioned method, the multiple chamber pressure sensors are sequentially selected as the selected chamber pressure sensor, and then the sequence is repeated with respect to the selected chamber pressure sensor.

The measured value of the pressure change rate, which is caused in the chamber by allowing the gas to flow into the chamber and measured by the chamber pressure sensor, and the calculated value of the pressure change rate in the chamber, which is calculated by regarding the gas as an ideal gas are compared for all the chamber pressure sensors. With this comparison, all the chamber pressure sensors can be easily configured.

In an exemplary embodiment, the substrate processing system further includes a second gas flow path, a measurement device, and multiple fourth gas flow paths. The second gas flow path is connected to each of the multiple first gas flow paths via each of the multiple gas suppliers. The measurement device is connected to the second gas flow path. The measurement device includes a third gas flow path and a flow path pressure sensor. The third gas flow path is connected to the second gas flow path. The flow path pressure sensor is configured to detect the pressure in the third gas flow path. Each of the multiple fourth gas flow paths includes a corresponding one of the multiple first gas flow paths, a second gas flow path, and a third gas flow path. The step of acquiring the third volume includes a step of acquiring a fourth volume, a step of acquiring a second volume, and a step of acquiring a first volume. In the step of acquiring the second volume, the fourth volume of the selected fourth gas flow path acquired in the step of acquiring the fourth volume is used. In the step of acquiring the first volume, the fourth volume of the selected fourth gas flow path acquired in the step of acquiring the fourth volume is used. The fourth volume is the volume of a fourth gas flow path selected from among the multiple fourth gas flow paths and including the selected first gas flow path.

In an exemplary embodiment, the step of acquiring the fourth volume includes a step of acquiring a first measured pressure value, a step of evacuating the selected first and second gas flow paths, a step of acquiring a second measured pressure value, and a step of calculating the fourth volume. In the step of acquiring the first measured pressure value, in the state in which the gas is diffused into the third gas flow path, the first measured pressure value of the gas diffused into the third gas flow path is acquired using the flow path pressure sensor. In the step of evacuating the selected first and second gas flow paths, the selected first included in the selected fourth gas flow path and second gas flow paths are evacuated using an exhauster selected from among the multiple exhausters and corresponding to the selected fourth gas flow path. In the step of acquiring the second measured pressure value, in the state in which the gas diffused into the third gas flow path is diffused into the selected fourth gas flow path including the third gas flow path, the second measured pressure value of the gas diffused into the selected fourth gas flow path is acquired. In the step of acquiring the second measured pressure value, the second measured pressure value of the gas diffused into the selected fourth gas flow path is acquired using the flow path pressure sensor. In the step of calculating the fourth volume, the first measured pressure value, the second measured pressure value, and a predetermined value of a fifth volume of the third gas flow path are used. In the step of calculating the fourth volume, the fourth volume is calculated by regarding the gas diffused into the third gas flow path in the step of acquiring the first measured pressure value and the gas diffused into the selected fourth gas flow path in the step of acquiring the second measured pressure value as ideal gases.

In an exemplary embodiment, the step of acquiring the second volume includes a step of acquiring a leak rate and a step of evacuating the internal space of the selected chamber. The step of acquiring the second volume further includes a step of acquiring a third measured pressure value, a step of acquiring a fourth measured pressure value, and a step of calculating the second volume. In the step of acquiring the leak rate, the leak rate of the selected chamber is acquired using the selected chamber pressure sensor. In the step of evacuating the internal space of the selected chamber, the internal space of the selected chamber is evacuated using the exhauster selected from among the multiple exhausters and corresponding to the selected chamber. In the step of acquiring the third measured pressure value, in the state in which gas is diffused into the selected fourth gas flow path, the third measured pressure value of the gas diffused into the selected fourth gas flow path is acquired using the flow path pressure sensor. In the step of acquiring the fourth measured pressure value, the gas diffused into the selected fourth gas flow path in the step of acquiring the third measured pressure value is diffused into the selected fourth gas flow path and the internal space of the selected chamber. In the step of acquiring the fourth measured pressure value, the fourth measured pressure value of the gas diffused into the selected fourth gas flow path and the internal space of the selected chamber is acquired using the pressure after a first length of time until the pressure detected by the flow path pressure sensor stabilizes elapses. In the step of calculating the second volume, the third measured pressure value, the fourth measured pressure value, the fourth volume, the leak rate, and the first length of time are used. In the step of calculating the second volume, the gas diffused into the selected fourth gas flow path in the step of acquiring the third measured pressure value is regarded as an ideal gas. In the step of calculating the second volume, the gas diffused into the selected fourth gas flow path and the internal space of the selected chamber in the step of acquiring the fourth measured pressure value is regarded as an ideal gas. In the step of calculating the second volume, the second volume is calculated by regarding the gases as ideal gases as described above.

In an exemplary embodiment, the step of acquiring the first volume includes a step of acquiring a fifth measured pressure value, a step of evacuating the selected first gas flow path, a step of acquiring a sixth measured pressure value, and a step of calculating the first volume. In the step of acquiring the fifth measured pressure value, in the state in which the gas is diffused into the fifth gas flow path including the second gas flow path and the third gas flow path, the fifth measured pressure value of the gas diffused into the fifth gas flow path is acquired using the flow path pressure sensor. In the step of evacuating the selected first gas flow path, the selected first gas flow path is evacuated using the exhauster selected from among the multiple exhausters and corresponding to the selected chamber. In the step of acquiring the sixth measured pressure value, the gas diffused into the fifth gas flow path in the step of acquiring the fifth measured pressure value is diffused into the selected fourth gas flow path including the fifth gas flow path. In the step of acquiring the sixth measured pressure value, the sixth measured pressure value of the gas diffused into the selected fourth gas flow path is acquired using the flow path pressure sensor after the pressure detected by the flow path pressure sensor stabilizes. In the step of calculating the first volume, the fifth measured pressure value, the sixth measured pressure value, and the fourth volume are used. In the step of calculating the first volume, the first volume is calculated by regarding the gas diffused into the fifth gas flow path in the step of acquiring the fifth measured pressure value and the gas diffused into the selected fourth gas flow path in the step of acquiring the sixth measured pressure value as ideal gases.

In an exemplary embodiment, the step of acquiring the first volume is performed following the step of acquiring the second volume, and the fourth measured pressure value is used as the fifth measured pressure value.

In an exemplary embodiment, the step of acquiring the second volume is performed following the step of acquiring the first volume, and the sixth measured pressure value is used as the third measured pressure value.

Hereinafter, various exemplary embodiments will be described in detail with reference to the drawings. In each of the drawings, the same or corresponding parts will be denoted by the same reference numerals.

Figure 1:
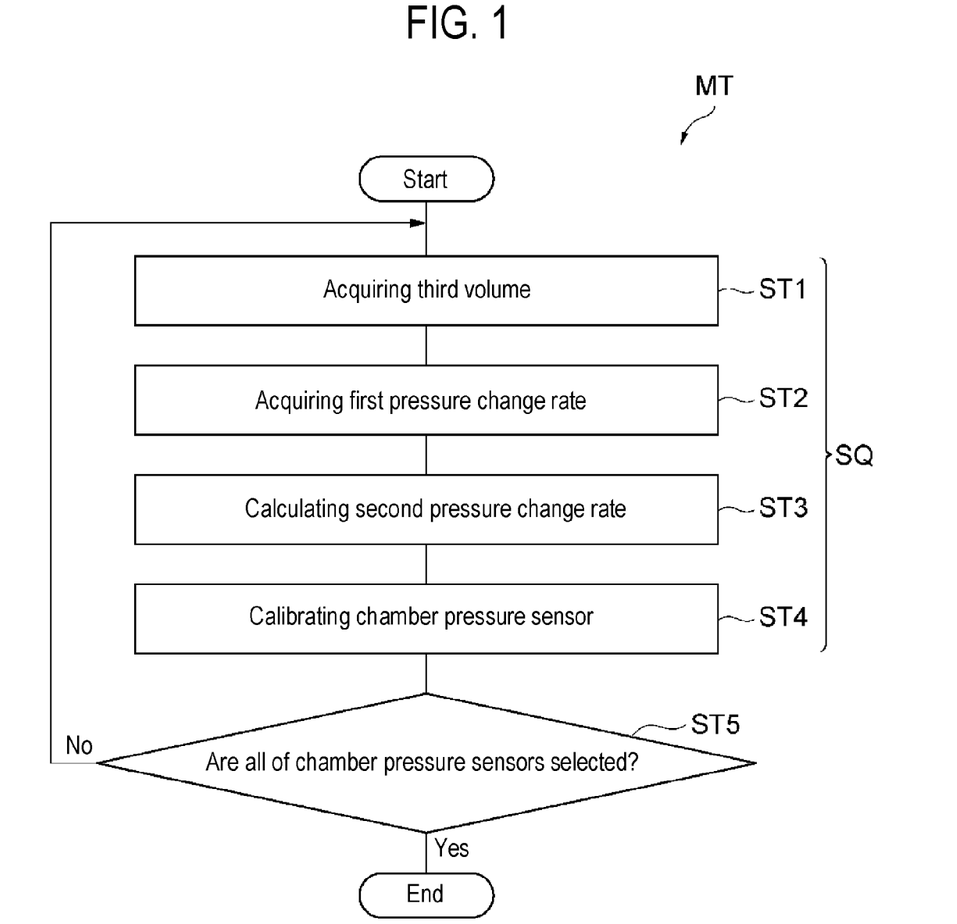
FIG. 1 is a flowchart illustrating a method of calibrating multiple chamber pressure sensors of a substrate processing system according to an exemplary embodiment.
Figure 2:
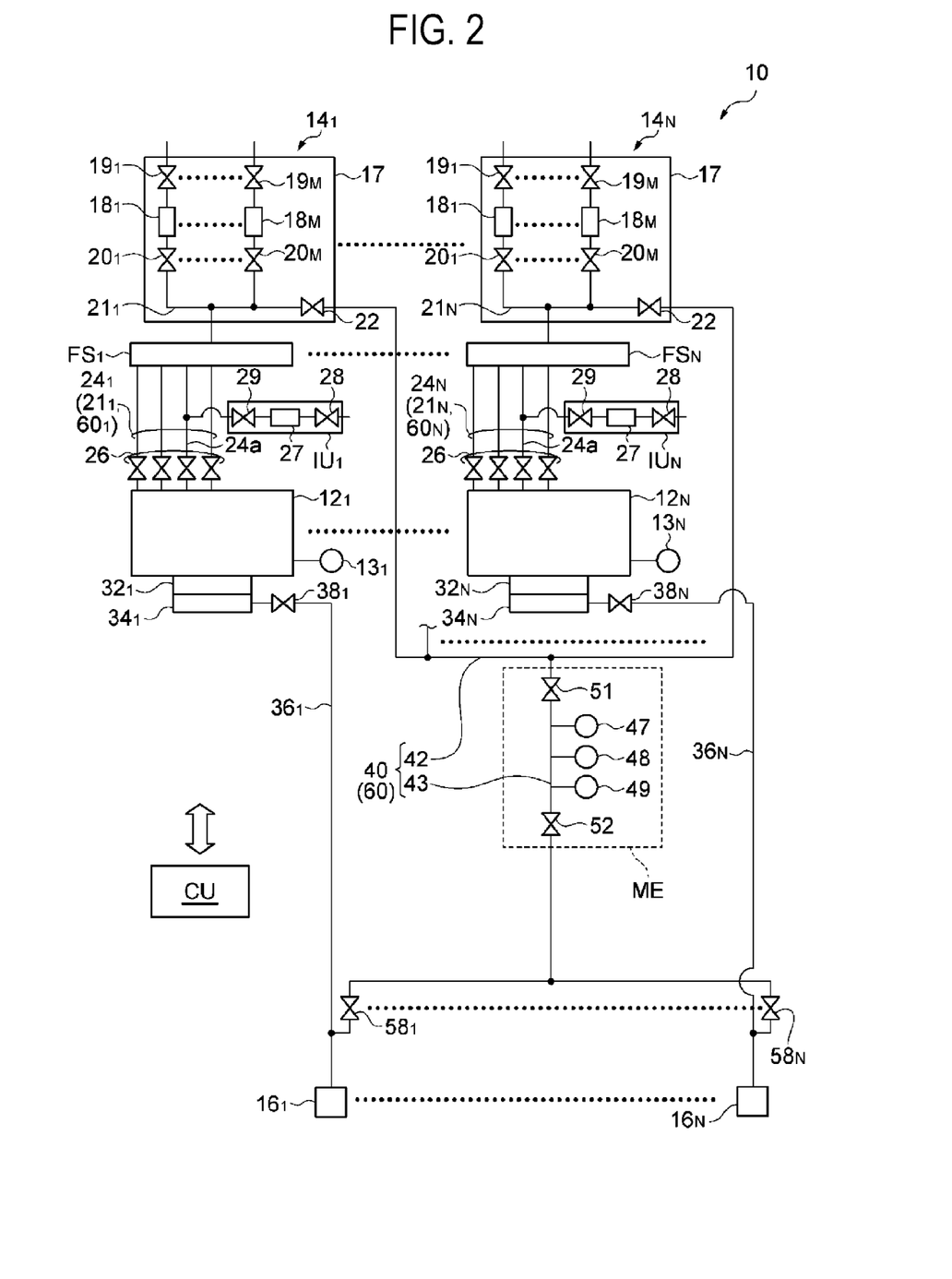
FIG. 2 is a view schematically illustrating the configuration of a substrate processing system that executes the flowchart illustrated in FIG. 1.

FIG. 1 is a flowchart of a method of calibrating multiple chamber pressure sensors of a substrate processing system (method MT) according to an exemplary embodiment. The method MT illustrated in FIG. 1 is performed in order to calibrate multiple chamber pressure sensors in a substrate processing system. FIG. 2 is a view schematically illustrating the configuration of a substrate processing system that executes the flowchart illustrated in FIG. 1. The method MT illustrated in FIG. 1 may be performed in the substrate processing system 10 illustrated in FIG. 1.

In an embodiment, the substrate processing system 10 includes multiple chambers 12, multiple chamber pressure sensors 13, multiple gas suppliers 14, and multiple first gas flow paths 21. The substrate processing system 10 includes multiple pressure control valves 32, multiple turbo molecular pumps 34, multiple exhaust flow paths 36, multiple valves 38, multiple valves 58, and multiple exhausters 16. The substrate processing system 10 may further include multiple flow splitters FS and multiple gas injectors IU.

In the substrate processing system 10, each of the number of multiple chambers 12, the number of multiple chamber pressure sensors 13, the number of multiple gas suppliers 14, the number of multiple first gas flow paths 21, and the number of multiple flow splitters FS is N. In the substrate processing system 10, each of the number of multiple pressure control valves 32, the number of multiple turbo molecular pumps 34, the number of multiple exhaust flow paths 36, the number of multiple valves 38, the number of multiple valves 58, and the number of multiple exhausters 16 is N. In the substrate processing system 10, the number of gas injectors IU may be N. "N" is an integer of 2 or more.

In the following description, when one of N elements of the substrate processing system 10 is referred to, the subscript "n" is added to the end of the reference numeral indicating the element. For example, when referring to one of the multiple (N) chambers 12, the reference numeral "$12_n$" is used. Here, "n" is an integer of 1 or more and N or less.

The substrate processing system 10 includes multiple process modules. Each of the multiple process modules includes a chamber $12_n$, a chamber pressure sensor $13_n$, a gas supplier $14_n$, a pressure control valve $32_n$, a turbo molecular pump $34_n$, an exhausters $16_n$, and a first gas flow path $21_n$, in which the same number n is included in the reference numerals. Each of the multiple process modules may further include a flow splitter $FS_n$ and a gas injector $IU_n$, in which the same number n is included in the reference numerals.

Each of the multiple chambers 12 provides an internal space. Each of the multiple chambers 12 is configured to accommodate a substrate in the internal space thereof.

Each of the multiple chamber pressure sensors 13 is configured to measure the pressure in a corresponding one of the multiple chambers 12 (the gas pressure in the internal space of the corresponding one). That is, the chamber pressure sensor $13_n$ is configured to measure the pressure in the internal space of the chamber $12_n$ (the gas pressure in the internal space of the chamber $12_n$).

Each of the multiple gas suppliers 14 is configured to supply gas to the internal space of a corresponding one of the multiple chambers 12. That is, the gas supplier $14_n$ is configured to supply gas to the internal space of the chamber $12_n$.

Each of the multiple gas suppliers 14 includes one or more flow rate controllers, one or more primary valves, and one or more secondary valves. In an embodiment, each of the multiple gas suppliers 14 includes multiple flow rate controllers 18, multiple primary valves 19, multiple secondary valves 20, and a valve 22. Each of the multiple gas suppliers 14 may further include a housing 17.

In an embodiment, each of the number of flow rate controllers 18, the number of primary valves 19, and the number of secondary valves 20 of each of the multiple gas supplier 14 is M. "M" is an integer of 2 or more.

In the following description, when one of M elements of the substrate processing system 10 is referred to, the subscript "m" is added to the end of the reference numeral indicating the element. For example, when referring to one of the multiple (M) flow rate controllers 18, the reference numeral "$18_m$" is used. Here, "m" is an integer of 1 or more and M or less.

In each of the multiple gas suppliers 14, the multiple flow rate controllers 18, the multiple primary valves 19, and the multiple secondary valves 20 are accommodated in the housing 17. Each of the multiple flow rate controllers 18 is a mass flow controller or a pressure-control-type flow rate controller. Each of the multiple primary valves 19 is connected to each of primary sides (upstream sides) of the multiple flow rate controllers 18. Each of the multiple primary valves 19 is connected to a corresponding gas source (not shown) installed on the primary side (upstream side) of the multiple primary valve 19. Each of the multiple secondary valves 20 is connected to each of secondary sides (downstream sides) of the multiple flow rate controllers 18.

Each of the multiple first gas flow paths 21 connects a corresponding one of the multiple gas suppliers 14 to the internal space of a corresponding one of the multiple chambers 12. That is, the first gas flow path $21_n$ connects the gas supplier $14_n$ to the internal space of the chamber $12_n$.

Each of the multiple first gas flow paths 21 includes a corresponding one of multiple distribution flow path groups 24. That is, the first gas flow path $21_n$ includes the distribution flow path group $24_n$.

Each of the multiple first gas flow paths 21 is connected to the internal space of a corresponding one of the multiple chambers 12 via a corresponding one of the multiple flow splitters FS, a corresponding one of the multiple distribution flow path groups 24, and multiple valves 26. That is, the first gas flow path $21_n$ is connected to the internal space of the chamber $12_n$ via the flow splitter $FS_n$, the distribution flow path group $24_n$, and the multiple valves 26.

Each of the multiple first gas flow paths 21 is connected to multiple secondary valves 20 of a corresponding one of the multiple gas suppliers 14. That is, the first gas flow path $21_n$ is connected to the secondary valves 20 of the gas supplier $14_n$.

Each of the multiple first gas flow paths 21 is connected to a second gas flow path 42 via the valve 22 of the corresponding one of the multiple gas suppliers 14. That is, the first gas flow path $21_n$ is connected to the second gas flow path 42 via the valve 22 of the gas supplier $14_n$.

Each of the multiple flow splitters FS distributes the gas supplied to an input port of the flow splitter FS via a corresponding one of the multiple first gas flow paths 21. In other words, each of the multiple flow splitters FS outputs, from multiple output ports of the flow splitter FS, the gas supplied to the input port of the flow splitter FS via the corresponding one of the multiple first gas flow paths 21. That is, the flow splitter $FS_n$ distributes the gas supplied to the input port of the flow splitter FS via the first gas flow path $21_n$ (outputs the gas from the multiple output ports of the flow splitter FS).

Each of the multiple distribution flow path groups 24 includes multiple distribution flow paths. In the illustrated example, the number of multiple distribution flow paths is 4, but is not limited thereto.

The multiple distribution flow paths of each of the multiple distribution flow path groups 24 are connected in parallel between a corresponding one of the multiple flow splitters FS and a corresponding one of the multiple chambers 12. That is, the multiple distribution flow paths of the distribution flow path group $24_n$ are connected in parallel between the flow splitter $FS_n$ and the chamber $12_n$.

The multiple distribution flow paths of each of the multiple distribution flow path groups 24 are connected to multiple output ports of a corresponding one of the multiple flow splitters FS. That is, the multiple distribution flow paths of the distribution flow path group $24_n$ are connected to the multiple output ports of the flow splitter $FS_n$.

The gas supplied from a corresponding one of the multiple gas suppliers 14 to a corresponding one of the multiple flow splitters FS is distributed to each of the multiple distribution flow paths of the multiple distribution flow path groups 24. Each of the multiple distribution flow paths of the multiple distribution flow path groups 24 is connected to a corresponding one of the multiple chambers 12 via each of the multiple valves 26. That is, the gas supplied from the gas supplier $14_n$ to the flow splitter $FS_n$ is distributed to each of the multiple distribution flow paths of the distribution flow path group $24_n$. Each of the multiple distribution flow paths of the distribution flow path group $24_n$ is connected to the chamber $12_n$ via each of the multiple valves 26.

The multiple distribution flow paths of the multiple distribution flow path groups 24 are installed in order to supply gas to multiple different areas of a substrate disposed within a corresponding chamber. In an embodiment, the multiple different areas of the substrate may be multiple concentric areas centered on the center of the substrate.

Each of the multiple gas injectors IU is connected to one distribution flow path of a corresponding one (a distribution flow path 24a in the illustrated example) of the multiple distribution flow path groups 24. Each of the multiple gas injectors IU is configured to inject gas into one distribution flow path of a corresponding distribution flow path group. That is, the gas injector $IU_n$ is connected to the distribution flow path 24a among the multiple distribution flow paths of the distribution flow path group $24_n$. The gas injector $IU_n$ is configured to inject gas into the distribution flow path 24a of the distribution flow path group $24_n$.

In an embodiment, each of the multiple gas injectors IU includes a flow rate controller 27, a primary valve 28, and a secondary valve 29. The primary valve 28 is connected to the primary side (upstream side) of the flow rate controller 27. The secondary valve 29 is connected to the secondary side (downstream side) of the flow rate controller 27. The flow rate controller 27 is connected to a gas source (not shown) via the primary valve 28. The flow rate controller 27 is connected to one distribution flow path (e.g., the distribution flow path 24a) of a corresponding distribution flow path group via the secondary valve 29.

The substrate processing system 10 may include gas injectors IU, the number of which is larger than N. In this case, a gas injector may be connected to each of two or more distribution flow paths among the multiple distribution flow paths of each of the multiple distribution flow path groups 24.

Each of the multiple pressure control valves 32 is, for example, an automatic pressure control valve. The pressure control valve $32_n$ is configured to regulate the pressure in the internal space of the corresponding chamber $12_n$.

Each of the multiple exhausters 16 may be, for example, a dry pump. The exhaust flow path $36_n$ is connected to the internal space of the corresponding chamber $12_n$ via the pressure control valve $32_n$, the turbo molecular pump $34_n$, and the valve $38_n$. In the downstream of the valve $38_n$, the exhauster $16_n$ is connected to the exhaust flow path $36_n$.

The substrate processing system 10 further includes a fifth gas flow path 40 and a measurement device ME. The fifth gas flow path 40 is connected to each of the multiple first gas flow paths 21 via the valve 22 of each of the multiple gas suppliers 14. That is, the fifth gas flow path 40 is connected to the first gas flow path $21_n$ via the valve 22 of the gas supplier $14_n$. The measurement device ME is connected to the second gas flow path 42.

In an embodiment, the fifth gas flow path 40 includes a second gas flow path 42 and a third gas flow path 43. In an embodiment, the measurement device ME includes a valve 51, the third gas flow path 43, and a valve 52.

The substrate processing system 10 further includes multiple fourth gas flow paths 60. Each of multiple fourth gas flow paths 60 includes a first gas flow path selected from among the multiple first gas flow paths 21, and the fifth gas flow path 40 (the second gas flow path 42 and the third gas flow path 43). The number of multiple fourth gas flow paths 60 is N. That is, the fourth gas flow path $60_n$ includes the first gas flow path $21_n$ and the fifth gas flow path 40.

The second gas flow path 42 is connected to each of the multiple first gas flow paths 21 via the valve 22 of each of the multiple gas suppliers 14. That is, the second gas flow path 42 is connected to the first gas flow path $21_n$ via the valve 22 of the gas supplier $14_n$.

The third gas flow path 43 is connected to the second gas flow path 42 via the valve 51. The third gas flow path 43 is connected to each of the multiple exhausters 16 via the valve 52, each of the multiple valves 58, and each of the multiple exhaust flow paths 36. That is, the third gas flow path 43 is connected to the exhauster $16_n$ via the valve 52, the valve $58_n$, and the exhaust flow path $36_n$.

In an embodiment, the measurement device ME further includes a pressure sensor 47 (flow path pressure sensor), a pressure sensor 48 (flow path pressure sensor), and a temperature sensor 49. Each of the pressure sensor 47 and the pressure sensor 48 is configured to measure the pressure within the third gas flow path 43. The temperature sensor 49 is configured to measure the temperature within the third gas flow path 43.

In an embodiment, the substrate processing system 10 may further include a controller CU. The controller CU may be a computer device including a processor such as a CPU, a non-transitory computer readable storage device such as a memory, an input device such as a keyboard, a display device, and the like. The controller CU executes a control program stored in the storage device by the processor, and controls each part of the substrate processing system 10 according to recipe data stored in the storage device. The method MT can be executed by controlling and calculating each part of the substrate processing system 10 by the controller CU.

See FIG. 1 again. The method MT will be described in detail below. In addition, the control and calculation performed by the controller CU for executing the method MT will be described.

The method MT includes step ST1, step ST2, step ST3, step ST4, and step ST5. Step ST1, step ST2, step ST3, and step ST4 constitute a sequence SQ. The sequence SQ can be repeatedly executed according to determination results in step ST5.

First, step ST1 is executed. In step ST1, a third volume V3, which is the sum of a first volume V1 and a second volume V2, is acquired. The first volume V1 is the volume of the first gas flow path $21_n$ connected to the gas supplier $14_n$. The second volume V2 is the volume of the internal space of the chamber $12_n$ connected to the first gas flow path $21_n$. A more detailed description of step ST1 will be described later with reference to FIG. 3.

In the subsequent step ST2, a first pressure change rate R1 is acquired using the chamber pressure sensor $13_n$ for the chamber $12_n$. The first pressure change rate R1 is a measured value of the pressure change rate of the internal space of the chamber $12_n$ that is caused by allowing gas having a preset flow rate Q1 to flow to the internal space of the chamber $12_n$ from the gas supplier $14_n$ via the first gas flow path $21_n$.

In the measurement of the first pressure change rate R1, the controller CU sets the pressure control valve $32_n$, the valve $38_n$, and the multiple valves 26 connected to the chamber $12_n$ to be in an open state, and sets the valve 22 of the gas supplier 14n, the valve 51, and the valve 52 to be in the closed state. Thereafter, the controller CU starts supply of gas having the flow rate Q1.

After the supply of the gas having the flow rate Q1 is started and then the pressure detected by the chamber pressure sensor $13_n$ is stabilized, the controller CU sets the pressure control valve $32_n$ to be in the closed state and acquires the first pressure change rate R1.

The pressure change rate may be expressed as a value of pressure change per unit time (the same applies to the following description). For example, when the value of pressure change during a length of time Δt is ΔP, the pressure change rate is expressed by ΔP/Δt.

In the subsequent step ST3, a second pressure change rate R2 is calculated. The second pressure change rate R2 is a calculated value of the pressure change rate of the internal space of the chamber $12_n$ that is caused by allowing the gas to flow in step ST2 and is calculated by using the flow rate Q1 of the gas allowed to flow in step ST2 and the third volume V3 and regarding the gas allowed to flow in step ST2 as an ideal gas. As a temperature measurement value TH, the temperature measurement value detected when the second volume V2 is measured may be used.

In step ST3, the second pressure change rate R2 can be calculated using the following relational expression (1) based on the equation of state of an ideal gas.

$$R2 = Q1 \times R \times TH / V3 \qquad (1)$$

In the subsequent step ST4, the chamber pressure sensor $13_n$ is calibrated such that the difference between the first pressure change rate R1 and the second pressure change rate R2 is within a preset range.

In the subsequent step ST5, it is determined whether or not all the chamber pressure sensors 13 have been selected. In this way, by step ST5, a sequence SQ including the above-mentioned step ST1, step ST2, step ST3, and step ST4 is repeatedly performed. In step ST5, the sequence SQ is repeated by sequentially selecting the multiple chamber pressure sensors 13 as the chamber pressure sensor $13_n$ ($1 \le n \le N$).

Figure 3:
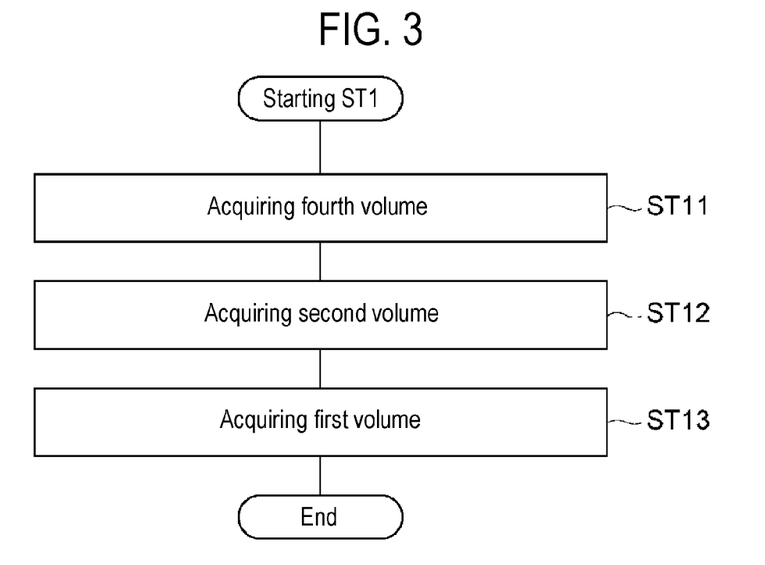
FIG. 3 is a flowchart illustrating an example of step ST1 illustrated in FIG. 1.

Next, the details of step ST1 illustrated in FIG. 1 will be described with reference to FIGS. 3, 4, 5, and 6. As illustrated in FIG. 3, step ST1 includes step ST11, step ST12, and step ST13. Step ST12 is executed after step ST13, but is not limited thereto. Step ST13 may be executed after step ST12.

First, the execution of step ST1 may be started by starting the execution of step ST11. In step ST11, a fourth volume V4 of the fourth gas flow path $60_n$ is acquired.

Figure 4:
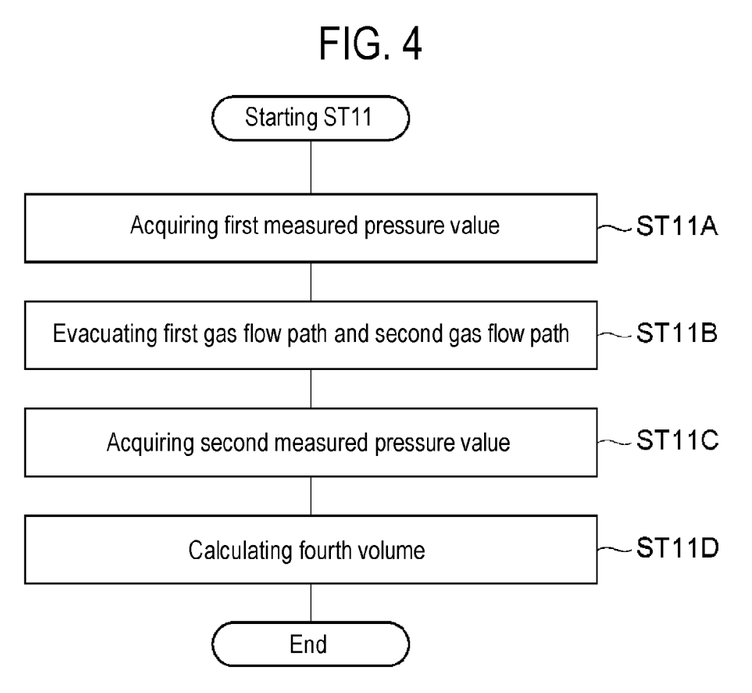
FIG. 4 is a flowchart illustrating an example of step ST11 illustrated in FIG. 3.

Step ST11 will be described in detail with reference to FIG. 4. Step ST11 includes step ST11A, step ST11B, step ST11C, and step ST11D.

In step ST11A, a first measured pressure value P1 is acquired. The first measured pressure value P1 is a measured pressure value of gas diffused into the third gas flow path 43. The first measured value P1 is acquired using the pressure sensor 47 and/or the pressure sensor 48 in the state in which the gas is diffused into the third gas flow path 43.

In order to execute step ST11A, the controller CU may allow gas to flow from the gas supplier $14_n$ to the third gas flow path 43 in a state in which the valve 52 and the multiple valves 26 connected to the chamber $12_n$ are in the closed state and the valve 22 of the gas supplier $14_n$ and the valve 51 are in the open state so as to cause gas to flow from the gas supplier $14_n$ to the third gas flow path 43. In step ST11A, the gas remaining in the third gas flow path 43 may be used before the execution of step ST11A.

In this way, in order to execute step ST11A, the controller CU controls the opening/closing operations of the multiple valves 26 connected to the chamber $12_n$, the valve 22 of the gas supplier $14_n$, the valves 51, and the valve 52. The controller CU may control the gas supply operation of the gas supplier $14_n$.

In the subsequent step ST11B, the first gas flow path $21_n$ and the second gas flow path 42 are evacuated using the exhauster $16_n$.

In order to execute step ST11B, the controller CU sets the multiple secondary valves 20 of the gas supplier $14_n$, the valve 51, and the valve 52 to be in the closed state, and sets the valve 22 of the gas supplier $14_n$, the multiple valves 26 connected to the chamber $12_n$, and the pressure control valve $32_n$ to be in the open state.

As described above, in order to execute step ST11B, the controller CU controls the opening/closing operations of the valve 22 and the multiple secondary valves 20 of the gas supplier $14_n$, the multiple valves 26 connected to the chamber $12_n$, the pressure control valve $32_n$, the valve 51, and the valve 52.

In the subsequent step ST11C, a second measured pressure value P2 is acquired. The second measured pressure value P2 is a measured pressure value of gas diffused into the fourth gas flow path $60_n$. The second measured pressure value P2 is acquired using the pressure sensor 47 and/or the pressure sensor 48 in the state in which the gas diffused into the third gas flow path 43 in step ST11A is diffused into the fourth gas flow path $60_n$.

In order to execute step ST11C, the controller CU sets the multiple secondary valves 20 of the gas supplier $14_n$, the multiple valves 26 connected to the chamber $12_n$, and the valve 52 to be in the closed state, and sets the valve 22 of the gas supplier $14_n$ and the valve 51 to be in the open state. As described above, in order to execute step ST11C, the controller CU controls the opening/closing operations of the multiple valves 26 connected to the chamber $12_n$, the valve 22 and the multiple secondary valves 20 of the gas supplier $14_n$, the valve 51, and the valve 52.

In the subsequent step ST11D, the fourth volume V4 is calculated. In the calculation of the fourth volume V4, the first measured pressure value P1, the second measured pressure value P2, and a predetermined value V5 of the fifth volume of the third gas flow path 43 are used. In the calculation of the fourth volume V4, the gas diffused into the third gas flow path 43 in step ST11A and the gas diffused into the fourth gas flow path $60_n$ in step ST11C are further regarded as ideal gases. In the calculation of the fourth volume V4, the following relational expression (2) based on Boyle-Charles' law is used.

$$P1 \times V5 = P2 \times V4 \qquad (2)$$

The fourth volume V4 is calculated by the relational expression, V4=P1×V5/P2, obtained from the relational expression (2).

Descriptions will be made returning back to FIG. 3 again. In step ST12 executed after step ST11, the second volume V2 of the chamber $12_n$ is acquired.

Figure 5:
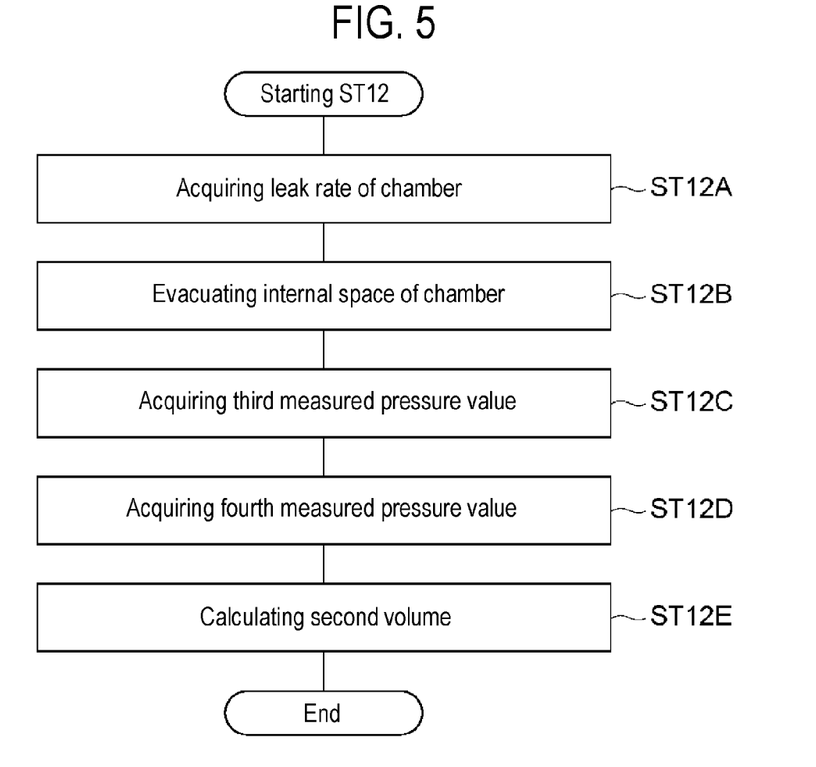
FIG. 5 is a flowchart illustrating an example of step ST12 illustrated in FIG. 3.

Step ST12 will be described in detail with reference to FIG. 5. Step ST12 includes step ST12A, step ST12B, step ST12C, step ST12D, and step ST12E.

In step ST12A, a leak rate LR of the chamber $12_n$ is acquired using the chamber pressure sensor $13_n$. The leak rate LR is expressed by a pressure change per unit time in the chamber $12_n$ in the closed state.

In order to execute step ST12A, the controller CU sets the multiple valves 26 and the pressure control valves $32_n$ connected to the chamber $12_n$ to be in the closed state.

In this way, in order to execute step ST12A, the controller CU controls the opening/closing operations of the multiple valves 26 and the pressure control valve $32_n$ connected to the chamber $12_n$.

In the subsequent step ST12B, the internal space of the chamber $12_n$ is evacuated using the exhauster $16_n$.

In order to execute step ST12B, the controller CU sets the multiple valves 26 connected to the chamber $12_n$ to be in the closed state, and sets the pressure control valves $32_n$ to be in the open state.

In this way, in order to execute step ST12B, the controller CU controls the opening/closing operations of the multiple valves 26 and the pressure control valve $32_n$ connected to the chamber $12_n$.

In the subsequent step ST12C, in the state in which the gas is diffused into the fourth gas flow path $60_n$, the third measured pressure value P3 of the gas diffused into the fourth gas flow path $60_n$ is acquired using the pressure sensor 47 and/or the pressure sensor 48.

In order to execute step ST12C, the controller CU sets the multiple secondary valves 26 connected to the chamber $12_n$ and the valve 52 to be in the closed state, and sets the valve 22 of the gas supplier $14_n$ and the valve 51 to be in the open state. In addition, in order to execute step ST12C, the controller CU may cause gas to flow from the gas supplier $14_n$ to the fourth gas flow path $60_n$. In step ST12C, the gas remaining in the fourth gas flow path $60_n$ may be used before the execution of step ST12C.

In this way, in order to execute step ST12C, the controller CU controls the opening/closing operations of the valve 22, the multiple valves 26 connected to the chamber $12_n$, the valve 52, and the valve 51. The controller CU may control the gas supply operation of the gas supplier $14_n$.

In the subsequent step ST12D, a fourth measured pressure value P4 is acquired. In step ST12D, first, the gas diffused into the fourth gas flow path $60_n$ in step ST12C is diffused into the fourth gas flow path $60_n$ and the internal space of the chamber $12_n$. Thereafter, after a first length of time Δt1 until the pressure detected by the pressure sensor 47 and/or the pressure sensor 48 stabilizes elapses, the fourth measured pressure value P4 of the gas diffused into the fourth gas flow path $60_n$ and the internal space of the chamber $12_n$ is acquired using the corresponding pressure sensor.

In order to execute step ST12D, the controller CU sets the pressure control valve $32_n$ to be in the closed state and sets the multiple valves 26 connected to the chamber $12_n$ to be in the open state.

In this way, in order to execute step ST12D, the controller CU controls the opening/closing operations of the pressure control valve $32_n$ and the multiple valves 26 connected to the chamber $12_n$.

In the subsequent step ST12E, the second volume V2 is calculated. In the calculation of the second volume V2, the third measured pressure value P3, the fourth measured pressure value P4, the fourth volume V4, the leak rate LR, and Δt1 are used. In the calculation of the second volume V2, the gas diffused into the fourth gas flow path $60_n$ in step ST12C and the gas diffused into the fourth gas flow path $60_n$ and the internal space of the chamber $12n$ in step ST12D are regarded as ideal gases. In the calculation of the second volume V2, the following relational expression (3) based on Boyle-Charles' law is used.

$$P3 \times V4 = P4 \times (V4+V2) - LR \times \Delta t1 \times V2 \quad (3)$$

The second volume V2 is calculated by the relational expression, V2=(P3−P4)×V4/(P4−LR×Δt1), obtained from the relational expression (3).

Descriptions will be made returning back to FIG. 3 again. In step ST13 executed after step ST12, the first volume V1 of the first gas flow path $21_n$ is acquired.

Figure 6:
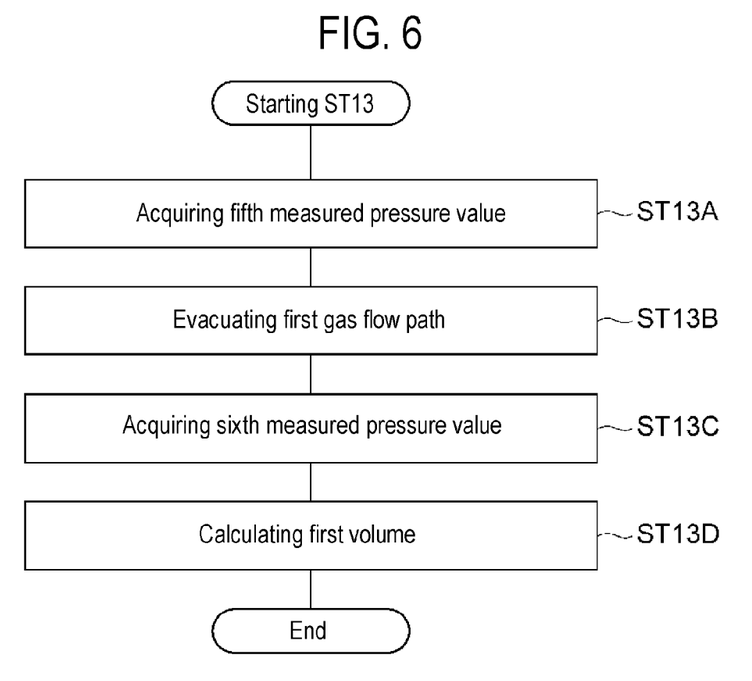
FIG. 6 is a flowchart illustrating an example of step ST13 illustrated in FIG. 3.

Step ST13 will be described in detail with reference to FIG. 6. Step ST13 includes step ST13A, step ST13B, step ST13C, and step ST13D.

In step ST13A, a fifth measured pressure value P5 of gas diffused into the acquired using the pressure sensor 47 and/or the pressure sensor 48 in the state in which the gas is diffused into the fifth gas flow path 40 including the second gas flow path 42 and the third gas flow path 43.

In order to execute step ST13A, the controller CU sets the multiple valves 26 connected to the chamber $12_n$ and the valve 52 to be in the closed state, and sets the valve 22 of the gas supplier $14_n$ and the valve 51 to be in the open state. In addition, in order to execute step ST13A, the controller CU may allow a preset amount of gas to flow from the gas supplier $14_n$ to the fifth gas flow path 40. In step ST13A, the gas remaining in the fifth gas flow path 40 before the execution of step ST13A may be used.

In this way, in order to execute step ST13A, the controller CU controls the opening/closing operations of the valve 22, the multiple valves 26 connected to the chamber $12_n$, the valve 52, and the valve 51. The controller CU may control the gas supply operation of the gas supplier $14_n$.

In the subsequent step ST13B, the first gas flow path $21_n$ is evacuated using the exhauster $16_n$.

In order to execute step ST13B, the controller CU sets the valve 22 and the multiple secondary valves 20 of the gas supplier $14_n$ to be in the closed state, and sets the multiple valves 26 connected to the chamber $12_n$ and the pressure control valve $32_n$ to be in the open state.

As described above, in order to execute step ST13B, the controller CU controls the opening/closing operations of the valve 22 and the multiple secondary valves 20 of the gas supplier $14_n$, the multiple valves 26 connected to the chamber $12_n$, and the pressure control valve $32_n$.

In the subsequent step ST13C, the gas diffused into the fifth gas flow path 40 in step ST13A is diffused into the fourth gas flow path $60_n$ including the fifth gas flow path 40. In step ST13C, after the pressure detected by the pressure sensor 47 and/or the pressure sensor 48 stabilizes, a sixth measured pressure value P6 of the gas diffused into the fourth gas flow path $60_n$ is acquired using the corresponding pressure sensor. The sixth measured pressure value P6 is acquired by the pressure sensor 47 and/or the pressure sensor 48.

In order to execute step ST13C, the controller CU sets the valve 22 of the gas supplier $14_n$ and the valve 51 to be in the open state, and sets the multiple valves 26 connected to the chamber $12_n$, the multiple secondary valves 20, and the valve 52 to be in the closed state.

As described above, in order to execute step ST13C, the controller CU controls the opening/closing operations of the valve 22 and the multiple secondary valves 20 of the gas supplier $14_n$, the multiple valves 26 connected to the chamber $12_n$, the valve 51, and the valve 52.

In the subsequent step ST13D, the first volume V1 is calculated. In the calculation of the first volume V1, the fifth measured pressure value P5, the sixth measured pressure value P6, and the fourth volume V4 are used. In the calculation of the first volume V1, the gas diffused into the fifth gas flow path 40 in step ST13A and the gas diffused into the fourth gas flow path $60_n$ in step ST13C are further regarded as ideal gases. In the calculation of the first volume V1, the following relational expression (4) based on Boyle-Charles' law is used.

$$P5 \times (V4-V1) = P6 \times V4 \quad (4)$$

The first volume V1 is calculated by the relational expression, V1=(P5−P6)×V4/P5, obtained from the relational expression (4).

According to the method MT according to an exemplary embodiment, a measured value of a first pressure change rate R1 of the chamber $12_n$, which is caused by allowing gas having a preset flow rate Q1 to flow to the chamber $12_n$, is obtained (actually measured) by the chamber pressure sensor $13_n$. Then, the calculated value of the second pressure change rate R2 in the chamber $12_n$ is acquired by regarding the gas having the flow rate Q1 as an ideal gas. The measured value of the first pressure change rate R1 and the calculated value of the second pressure change rate R2 are compared in all of the multiple chamber pressure sensors 13. Therefore, it is possible to easily configure the multiple chamber pressure sensors 13.

The first volume V1 of the first gas flow path $21_n$ and the second volume V2 of the internal space of the chamber $12_n$, which are necessary for calculating the second pressure change rate R2, are acquired using pressure values measured by the pressure sensor 47 and/or the pressure sensor 48 (actually measured values). The pressure sensor 47 and the pressure sensor 48 are installed in the third gas flow path 43, unlike the chamber pressure sensor $13_n$ installed in the chamber $12_n$. Accordingly, the pressure values measured by the pressure sensor 47 and/or the pressure sensor 48 are relatively less affected by deterioration over time, and the first volume V1 and the second volume V2 acquired based on such measured pressure values can be adopted as the values of actual volumes at the time of measurement. The calculated value of the second pressure change rate R2 which is calculated using the first volume V1 and the second volume V2 obtained as described above can be adopted as an actual pressure change rate at the time of measurement in the chamber $12_n$.

Although various exemplary embodiments have been described above, the present disclosure is not limited to the exemplary embodiments described above, and various omissions, substitutions, and changes may be made. In addition, elements in different exemplary embodiments may be combined to form another exemplary embodiment.

For example, when step ST13 for acquiring the first volume V1 is executed subsequent to step ST12 for acquiring the second volume V2, the fifth measured pressure value P5 acquired in step ST13A may be used as the fourth measured pressure value P4 acquired in step ST12D.

In addition, for example, when step ST12 for acquiring the second volume V2 is executed following step ST13 for acquiring the first volume V1, the sixth measured pressure value P6 acquired in step ST13C may be used as the third measured pressure value P3 acquired in step ST12C.

From the foregoing, it will be understood that various exemplary embodiments of the present disclosure have been described herein for purpose of illustration, and that various modifications can be made without departing from the scope and spirit of the present disclosure. Accordingly, the various exemplary embodiments disclosed herein are not intended to be limiting, and the true scope and spirit of the disclosure is indicated by the appended claims.

According to the present disclosure, it is possible to provide a technique for reducing a machine difference among multiple chamber pressure sensors provided in a substrate processing system.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of calibrating multiple chamber pressure sensors of a substrate processing system,
wherein the substrate processing system comprises:
a controller;
multiple chambers;
multiple chamber pressure sensors, each of which is installed so as to measure an internal pressure of a corresponding one of the multiple chambers;
multiple gas suppliers, each of which is configured to supply a gas to an internal space of a corresponding one of the multiple chambers;
multiple exhausters connected to the internal spaces of the multiple chambers via multiple exhaust flow paths, respectively; and
multiple first gas flow paths, each of which connects a corresponding one of the multiple gas suppliers to a corresponding one of the multiple chambers,
the method comprising:
determining, by the controller, a third volume, which is a sum of a first volume of a first gas flow path selected from among the multiple first gas flow paths connected to a gas supplier selected from among the multiple gas suppliers and a second volume of the internal space of a chamber selected from among the multiple chambers and connected to the selected first gas flow path;
acquiring, by the controller, a first pressure change rate of the internal space of the selected chamber, which is caused by allowing the gas having a preset flow rate to flow to the internal space of the selected chamber from the selected gas supplier via the selected first gas flow path, using a chamber pressure sensor for the selected chamber, which is selected from among the multiple chamber pressure sensors;
calculating, by the controller, a second pressure change rate of the internal space of the selected chamber, which is caused by allowing the gas to flow in the acquiring the first pressure change rate, by using the preset flow rate of the gas caused to flow in acquiring the first pressure change rate and the first volume and regarding the gas caused to flow in the acquiring the first pressure change rate as an ideal gas; and
calibrating, by the controller, the selected chamber pressure sensor such that a difference between the first pressure change rate and the second pressure change rate is within a preset range,
wherein a sequence including the determining the third volume, the acquiring the first pressure change rate, the acquiring the second pressure change rate, and the calibrating the chamber pressure sensor is repeated, and
wherein each of the selected chamber pressure sensor is sequentially selected from the multiple chamber pressure sensors and then the sequence which is repeated is performed with respect to the selected chamber pressure sensor.

2. The method of claim 1, wherein the substrate processing system further comprises:
a second gas flow path connected to each of the multiple first gas flow paths via each of the multiple gas suppliers;
a measurement device connected to the second gas flow path and including a third gas flow path connected to the second gas flow path and a flow path pressure sensor configured to detect a pressure within the third gas flow path; and
multiple fourth gas flow paths, each of which includes a corresponding one of the multiple first gas flow paths, the second gas flow path, and the third gas flow path,
wherein the determining the third volume further comprises:
determining a fourth volume of the fourth gas flow path which is selected from among the multiple fourth gas flow paths and includes the selected first gas flow path;
determining the second volume using the fourth volume of the selected fourth gas flow path acquired in the acquiring the fourth volume; and
determining the first volume using the fourth volume of the selected fourth gas flow path acquired in the acquiring the fourth volume.

3. The method of claim 2, wherein the determining the fourth volume further comprises:
acquiring, in a state in which the gas is diffused into the third gas flow path, a first measured pressure value of the gas diffused into the third gas flow path using the flow path pressure sensor;
evacuating the selected first gas flow path included in the selected fourth gas flow path and the second gas flow path using an exhauster which is selected from among the multiple exhausters and corresponds to the selected fourth gas flow path;

acquiring, in a state in which the gas diffused into the third gas flow path in the acquiring the first measured pressure value is diffused into the selected fourth gas flow path including the third gas flow path, a second measured pressure value of the gas diffused into the selected fourth gas flow path using the flow path pressure sensor; and calculating the fourth volume by using the first measured pressure value, the second measured pressure value, a predetermined value of a fifth volume of the third gas flow path, and regarding the gas diffused into the third gas flow path in the acquiring the first measured pressure value and the gas diffused into the selected fourth gas flow path in the acquiring the second measured pressure value as ideal gases.

4. The method of claim 3, wherein the determining the second volume comprises:

acquiring a leak rate of the selected chamber using the selected chamber pressure sensor;

evacuating the internal space of the selected chamber using a exhauster which is selected from among the multiple exhausters and corresponds to the selected chamber;

acquiring, in a state in which the gas is diffused into the selected fourth gas flow path, a third measured pressure value of the gas diffused into the selected fourth gas flow path using the flow path pressure sensor;

acquiring a fourth measured pressure value of the gas diffused into the selected fourth gas flow path and the internal space of the selected chamber using the flow path pressure sensor after a first length of time elapses until the pressure detected by the flow path pressure sensor stabilizes after the gas diffused into the selected fourth gas flow path in the acquiring the third measured pressure value is diffused into the selected fourth gas flow path and the internal space of the selected chamber; and calculating the second volume by using the third measured pressure value, the fourth measured pressure value, the fourth volume, the leak rate, and the first length of time, and regarding the gas diffused into the selected fourth gas flow path in the acquiring the third measured pressure value and the gas diffused into the selected fourth gas flow path and the internal space of the selected chamber in the acquiring the fourth measured pressure value as ideal gases.

5. The method of claim 4, wherein the determining the first volume comprises:

acquiring, in a state in which the gas is diffused into a fifth gas flow path including the second gas flow path and the third gas flow path, a fifth measured pressure value of the gas diffused into the fifth gas flow path using the flow path pressure sensor;

evacuating the selected first gas flow path using the exhauster which is selected from among the multiple exhausters and corresponds to the selected chamber;

acquiring a sixth measured pressure value of the gas diffused into the selected fourth gas flow path using the flow path pressure sensor after the gas diffused into the fifth gas flow path in the acquiring the fifth measured pressure value is diffused into the selected fourth gas flow path including the fifth gas flow path and then the pressure detected by the flow path pressure sensor is stabilized; and calculating the first volume by using the fifth measured pressure value, the sixth measured pressure value, and the fourth volume, and regarding the gas diffused into the fifth gas flow path in the acquiring the fifth measured pressure value and the gas diffused into the selected fourth gas flow path in the acquiring the sixth measured pressure value as ideal gases.

6. The method of claim 5, wherein the determining the first volume is performed subsequent to the determining the second volume, and the fourth measured pressure value is used as the fifth measured pressure value.

7. The method of claim 5, wherein the determining the second volume is performed subsequent to the determining the first volume, and the sixth measured pressure value is used as the third measured pressure value.

8. The method of claim 2, wherein the determining the second volume comprises:

acquiring a leak rate of the selected chamber using the selected chamber pressure sensor;

evacuating the internal space of the selected chamber using a exhauster which is selected from among the multiple exhausters and corresponds to the selected chamber;

acquiring, in a state in which the gas is diffused into the selected fourth gas flow path, a third measured pressure value of the gas diffused into the selected fourth gas flow path using the flow path pressure sensor;

acquiring a fourth measured pressure value of the gas diffused into the selected fourth gas flow path and the internal space of the selected chamber using the flow path pressure sensor after a first length of time elapses until the pressure detected by the flow path pressure sensor stabilizes after the gas diffused into the selected fourth gas flow path in the acquiring the third measured pressure value is diffused into the selected fourth gas flow path and the internal space of the selected chamber; and calculating the second volume by using the third measured pressure value, the fourth measured pressure value, the fourth volume, the leak rate, and the first length of time, and regarding the gas diffused into the selected fourth gas flow path in the acquiring the third measured pressure value and the gas diffused into the selected fourth gas flow path and the internal space of the selected chamber in the acquiring the fourth measured pressure value as ideal gases.

* * * * *